(12) United States Patent
Yin et al.

(10) Patent No.: US 12,408,304 B1
(45) Date of Patent: Sep. 2, 2025

(54) HIGH-TEMPERATURE RESISTANT SOLID-STATE RELAY

(71) Applicant: Jiangsu Gold Electric Control Technology Co., Ltd., Wuxi (CN)

(72) Inventors: Chenzhong Yin, Wuxi (CN); Zi Yin, Wuxi (CN); Tianchi Ma, Wuxi (CN); Xingcheng Zhu, Wuxi (CN); Yan Lv, Wuxi (CN)

(73) Assignee: Jiangsu Gold Electric Control Technology Co., Ltd., Wuxi (CN)

( * ) Notice: Subject to any disclaimer, the term of this patent is extended or adjusted under 35 U.S.C. 154(b) by 0 days.

(21) Appl. No.: 19/069,918

(22) Filed: Mar. 4, 2025

(30) Foreign Application Priority Data

Apr. 3, 2024 (CN) .......................... 202410401560.1

(51) Int. Cl.
*H05K 7/20* (2006.01)
*H05K 1/02* (2006.01)
*H05K 5/10* (2025.01)

(52) U.S. Cl.
CPC ......... *H05K 7/2039* (2013.01); *H05K 1/0203* (2013.01); *H05K 5/10* (2025.01); *H05K 2201/10166* (2013.01)

(58) Field of Classification Search
CPC .......... H05K 1/189; H05K 1/14; H05K 1/147; H05K 2201/047; H05K 2201/2018; H05K 7/2039; H05K 1/0203; H05K 5/10; H05K 2201/10166
See application file for complete search history.

(56) References Cited

U.S. PATENT DOCUMENTS

| | | | | |
|---|---|---|---|---|
| 6,166,464 A * | 12/2000 | Grant | ................. | H05K 7/20854 310/68 R |
| 7,619,896 B2 * | 11/2009 | Yamashita | ............. | H05K 7/026 361/720 |
| 8,929,079 B2 * | 1/2015 | Watanabe | .......... | H05K 7/20854 361/705 |

(Continued)

FOREIGN PATENT DOCUMENTS

CN 207993776 U 1/2018
CN 218849373 U 4/2023

OTHER PUBLICATIONS

Notification to Grant Patent Right for CN 202410401560.1, dated May 13, 2024, The State Intellectual Property Office of People's Republic of China, Beijing, China.

*Primary Examiner* — Adam B Dravininkas
(74) *Attorney, Agent, or Firm* — M&B IP Analysts, LLC

(57) ABSTRACT

Provided is a high-temperature resistant solid-state relay including a bottom board, a switch component, a PCB, a frame body, a top cover and a heat dissipation rack fixed with the bottom board. An upper surface of the bottom board is fixed with the switch component; the frame body is fixed with the bottom board; the PCB is embedded in the frame body; and the switch component is connected with the PCB. The PCB is provided with a large output copper column, a large input copper column, a small output control signal copper column and a small input control signal copper column. The top cover is located above the frame body. The bottom board is made of a first high-temperature resistant material; the heat dissipation rack, the frame body, the PCB and the top cover are made of a second high-temperature resistant material.

3 Claims, 2 Drawing Sheets

(56) References Cited

U.S. PATENT DOCUMENTS

| | | | |
|---|---|---|---|
| 10,435,060 B2* | 10/2019 | Hagiwara | H01R 12/7088 |
| 2013/0058044 A1* | 3/2013 | Watanabe | H05K 5/006 |
| | | | 361/714 |
| 2013/0075886 A1* | 3/2013 | Abe | H02M 7/003 |
| | | | 257/E25.027 |
| 2021/0096185 A1* | 4/2021 | Adkins | H01H 47/002 |

* cited by examiner

HIGH-TEMPERATURE RESISTANT SOLID-STATE RELAY

CROSS-REFERENCE TO RELATED PRESENT DISCLOSURE

This patent application claims the benefit and priority of Chinese Patent Application No. 202410401560.1 filed with the China National Intellectual Property Administration on Apr. 3, 2024, the disclosure of which is incorporated by reference herein in its entirety as part of the application.

TECHNICAL FIELD

The present disclosure relates to the technical field of relays, and in particular to a high-temperature resistant solid-state relay.

BACKGROUND

A solid-state relay is generally used in automatic circuit control, which is able to interact the control system with the controlled system, and plays the role of automatic adjustment, safety protection and circuit conversion in the circuit. Chinese Patent Publication No. CN218849373U discloses a square solid-state relay, which includes a frame body, a panel, a heat dissipation rack, a large output copper column, a large input copper column, a small output control signal copper column and a small input control signal copper column.

When the solid-state relay operates, due to the high power loss of the chip inside the solid-state relay, the solid-state relay will generate a large amount of heat, causing that the shell used in the solid-state relay will be at the risk of melting due to high temperature. The accumulated heat will also affect the operating performance of the solid-state relay. Therefore, the solid-state relay is generally used in cooperation with the heat sink. Chinese Patent Publication No. CN218849373U discloses a heat sink with a small size and a fast dissipating rate that is used in cooperation with the solid-state relay, in which the solid-state relay is placed on a mounting board, so that a bottom heat dissipation rack of the solid-state relay is connected with the mounting board. When the solid-state relay operates, the generated heat is transferred to the bottom heat dissipation rack of the solid-state relay for heat dissipation. The bottom heat dissipation rack transfers the absorbed heat to the mounting board, and the mounting board transfers the heat to the body of the heat sink for heat dissipation. The patent solves the problem that the operating performance of the solid-state relay is affected by the continuous heating of the solid-state relay during operation, thus achieving effective heat dissipation of the solid-state relay being generating heat.

However, the solid-state relay needs to be matched with heat sinks of different models in different use environments, resulting in that heat sinks of many models are needed, which cannot adapt to the specific environment in a short time, and cannot effectively solve the problem that the operation of the solid-state relay is affected by the heat generated by the solid-state relay.

SUMMARY

In view of the above problems, a high-temperature resistant solid-state relay according to the present disclosure can solve the problem in the prior art that the operation of the solid-state relay is affected by the heat generated by the solid-state relay in different environments, so that the solid-state relay can continue to maintain a stable operating state in the absence of a heat sink.

In order to achieve the above purpose, the technical scheme used by the present disclosure is as follows.

The present disclosure provides a high-temperature resistant solid-state relay, including a bottom board, a switch component, a Printed Circuit Board (PCB), a frame body for protecting the PCB, and a top cover.

An upper surface of the bottom board is fixed with the switch component; the frame body is fixed with the bottom board; the PCB is embedded in the frame body; and the switch component is connected with the PCB.

The PCB is provided with a large output copper column, a large input copper column, a small output control signal copper column and a small input control signal copper column; the large output copper column and the large input copper column are juxtaposed at one side, and an arrangement direction of the large output copper column and the large input copper column is regarded as a first arrangement direction; the small output control signal copper column and the small input control signal copper column are juxtaposed at an other side, and an arrangement direction of the small output control signal copper column and the small input control signal copper column is regarded as a second arrangement direction; the first arrangement direction is parallel to the second arrangement direction; the large output copper column and the small input control signal copper column are located on one same straight line; the large input copper column and the small output control signal copper column are located on an other same straight line; and top ends of the large output copper column, the large input copper column, the small output control signal copper column and the small input control signal copper column are provided with screw holes.

The top cover is located above the frame body; the top cover is formed with fixing holes corresponding to the screw holes on the top ends of the large output copper column, the large input copper column, the small output control signal copper column and the small input control signal copper column; and the top cover is fixed with the PCB through bolts.

The high-temperature resistant solid-state relay further includes a heat dissipation rack.

The heat dissipation rack is fixed with the bottom board; and the heat dissipation rack is located below the PCB.

The bottom board is made of a first high-temperature resistant material; and the heat dissipation rack, the frame body, the PCB and the top cover are made of a second high-temperature resistant material.

In the high-temperature resistant solid-state relay according to the present disclosure, the heat dissipation rack preferably includes a closed fence and barriers.

The fence is a concave vessel; the fence is fixed on the bottom board; a bottom of the fence is formed with a through hole in which the switch component is placed; the barriers are evenly distributed at a top of a side wall of the fence; and the frame body is located above the barriers.

An upper bottom surface of the fence is provided with four support columns; a bottom surface of the fence is rectangular; distribution directions of the four support columns are identical to distribution directions of four corners of the bottom surface of the fence; the four support columns are higher than the barriers; the PCB is formed with four openings corresponding to positions of the four support columns; the four support columns are located directly below the four openings; the four support columns are provided with screw holes; and the four support columns are fixed with the PCB by bolts.

In the high-temperature resistant solid-state relay according to the present disclosure, preferably, the first high-temperature resistant material is aluminum; and the bottom board is made of aluminum, which has a temperature resistant range up to 200° C.

In the high-temperature resistant solid-state relay according to the present disclosure, preferably, the second high-temperature resistant material is ceramic; and the heat dissipation rack, the frame body, the PCB and the top cover are all made of ceramic, which has a temperature resistance range of 200-300° C.

In the high-temperature resistant solid-state relay according to the present disclosure, preferably, the switch component is a carbonized Metal Oxide Semiconductor (mos) field-effect transistor; and a pin of the switch component is connected with the PCB.

In the high-temperature resistant solid-state relay according to the present disclosure, preferably, the bottom board is poured with a high-temperature resistant epoxy resin.

In the high-temperature resistant solid-state relay according to the present disclosure, preferably, tin for soldering components on the PCB has a temperature resistant range of 150-160° C.

The technical scheme has the following advantages or beneficial effects.

The high-temperature resistant solid-state relay according to the present disclosure is provided with a heat dissipation rack. The heat dissipation rack includes a closed fence and barriers. The barriers are evenly distributed at a top of a side wall of the fence. The frame body is located above the barriers. When the solid-state relay operates, the switch component in the solid-state relay generates heat since the switch component controls a high voltage. The existing solid-state relay generally has a shell tightly closed, so that the heat generated by the solid-state relay cannot be discharged from the interior of the solid-state relay in time and thus the heat is accumulated inside the solid-state relay, causing that the solid-state relay cannot continue to operate. The barriers are provided at the side of the solid-state relay, which provides a certain heat dissipation ability to the solid-state relay itself while ensuring the protection of the internal chip of the solid-state relay. In this way, the heat generated by the solid-state relay will not be accumulated, preventing the rapid rise of the temperature inside the solid-state relay.

In the high-temperature resistant solid-state relay according to the present disclosure, the bottom board is made of aluminum. A switch component is placed on the bottom board. The switch component is the main heating element in the solid-state relay. For the heating state of the switch component, the bottom board is replaced with aluminum, so that the bottom board has heat resistance and heat dissipation. In order to solve the problem in the prior art that the operation of the solid-state relay is affected by the heat generated by the solid-state relay in the absence of an adaptive heat sink, the solid-state relay can maintain the operating ability at a high temperature after having a certain heat dissipation capacity. Therefore, material of which the heat dissipation rack, the frame body, the PCB and the top cover in the solid-state relay are made is replaced with ceramic which has a temperature resistance range of 200° C.-300° C. After the solid-state relay operates for a period of time, the heat generated by the solid-state relay will rise and pass through the heat dissipation rack, the frame body, the PCB and the top cover, the components above made of ceramic can ensure the original performance after heat resistance In the high-temperature resistant solid-state relay according to the present disclosure, a carbonized mos field-effect transistor is selected as a switch component. The switch component is fixed on the bottom board by a high-temperature resistant epoxy resin. The carbonized mos field-effect transistor is excellent in heat resistance, which can ensure continuous operation in a condition of continuous heating itself. The high-temperature resistant epoxy resin fixes the switch component generating heat on the bottom board. At the same time, the bottom board is poured with the epoxy resin, so that the heat generated by the switch component can be transferred onto the epoxy resin. The epoxy resin of a large area can assist the heat dissipation rack in dissipating the heat generated by the switch component.

BRIEF DESCRIPTION OF THE DRAWINGS

The present disclosure and the features, the shapes and the advantages thereof will become more apparent by reading the detailed description of non-limiting embodiments with reference to the following drawings. Like reference numerals indicate like parts throughout the drawings. The drawings are not drawn to scale, and the emphasis is placed on illustrating the gist of the present disclosure.

DETAILED DESCRIPTION OF THE EMBODIMENTS

The present disclosure will be further described with reference to the drawings and specific embodiments, which is not limited to the present disclosure.

Embodiment 1

Figure 1:
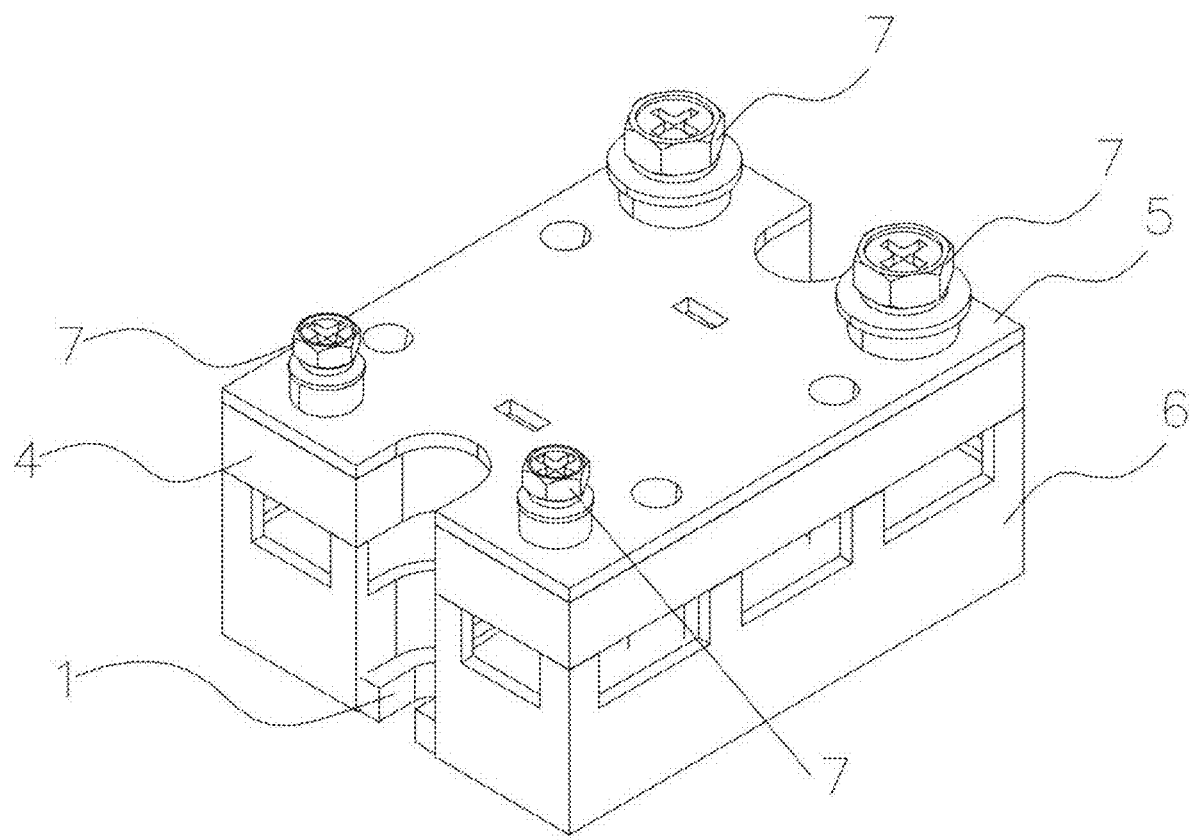
FIG. 1 is a schematic structural diagram of a high-temperature resistant solid-state relay according to Embodiment 1 of the present disclosure.
Figure 2:
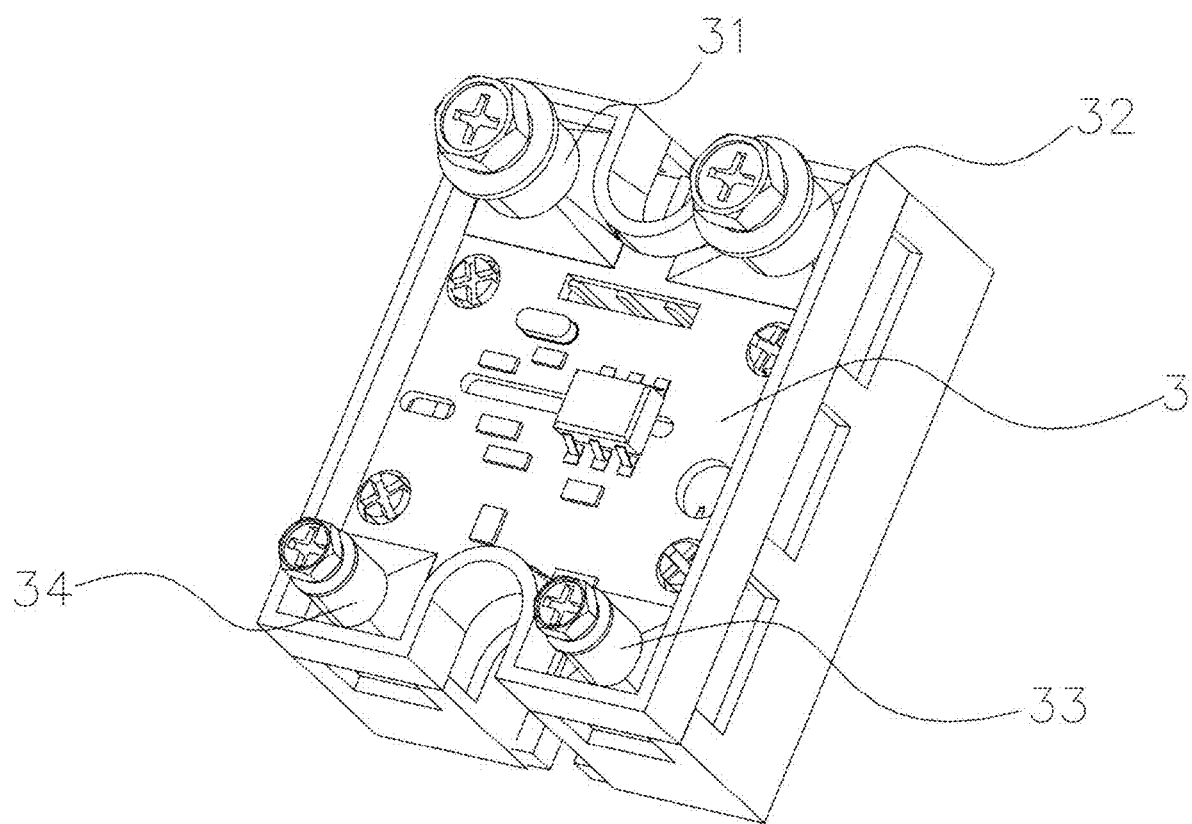
FIG. 2 is a schematic structural diagram of a Printed Circuit Board (PCB) of the high-temperature resistant solid-state relay according to Embodiment 1 of the present disclosure.
Figure 3:
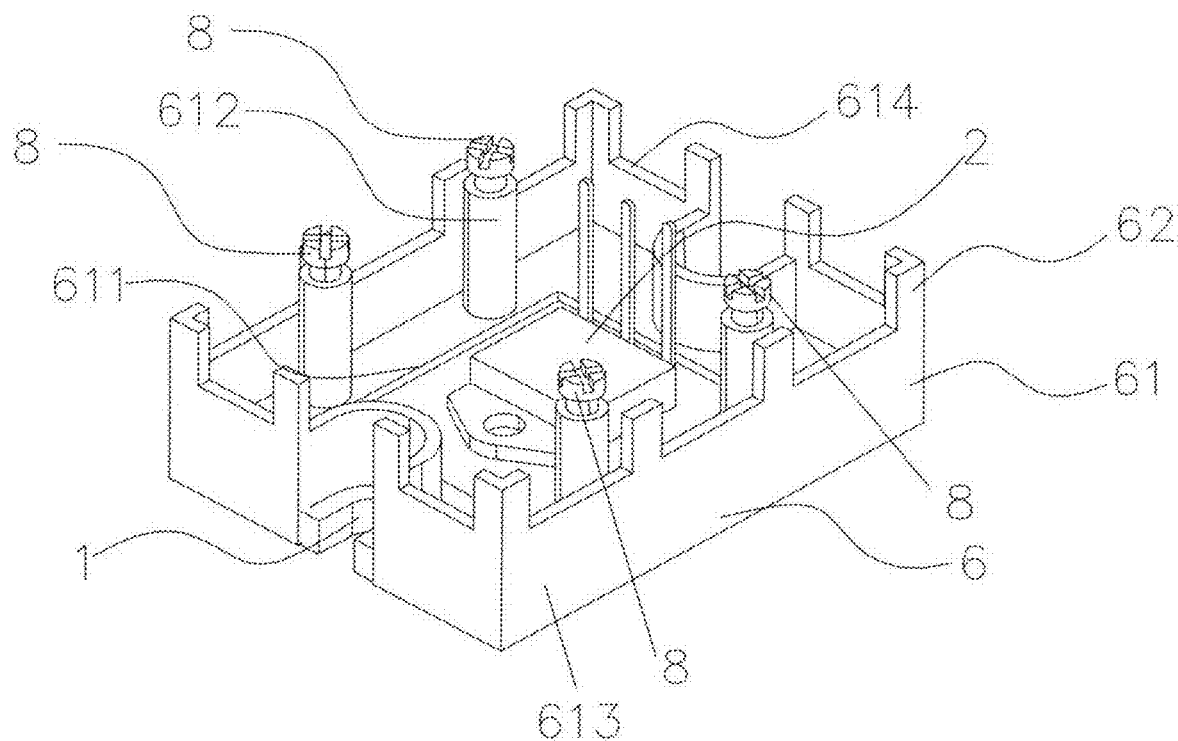
FIG. 3 is a schematic structural diagram of a switch component and a heat dissipation rack of the high-temperature resistant solid-state relay according to Embodiment 1 of the present disclosure.

As shown in FIG. 1 to FIG. 3, a high-temperature resistant solid-state relay according to Embodiment 1 of the present disclosure includes a bottom board 1, a switch component 2, a PCB 3, a frame body 4 for protecting the PCB, and a top cover 5.

An upper surface of the bottom board 1 is fixed with the switch component 2. The frame body 4 is fixed with the bottom board 1. The PCB 3 is embedded in the frame body 4. The switch component 2 is connected with the PCB 3.

The PCB 3 is provided with a large output copper column 31, a large input copper column 32, a small output control signal copper column 33 and a small input control signal copper column 34. The large output copper column 31 and the large input copper column 32 are juxtaposed at one side, and an arrangement direction of the large output copper column and the large input copper column is regarded as a first arrangement direction. The small output control signal copper column 33 and the small input control signal copper column 34 are juxtaposed at an other side, and an arrangement direction of the small output control signal copper column and the small input control signal copper column is regarded as a second arrangement direction. The first arrangement direction is parallel to the second arrangement direction. The large output copper column 31 and the small input control signal copper column 34 are located on one same straight line. The large input copper column 32 and the small output control signal copper column 33 are located on an other same straight line. Top ends of the large output copper column 31, the large input copper column 32, the small output control signal copper column 33 and the small input control signal copper column 34 are provided with screw holes.

The top cover 5 is located above the frame body 4. The top cover 5 is formed with fixing holes corresponding to screw holes on the top ends of the large output copper column 31, the large input copper column 32, the small output control signal copper column 33 and the small input control signal copper column 34. The top cover 5 is fixed with the PCB 3 through first bolts 7.

The high-temperature resistant solid-state relay further includes a heat dissipation rack 6. The heat dissipation rack 6 is fixed with the bottom board 1. The heat dissipation rack 6 is located below the PCB 3.

The bottom board 1 is made of a first high-temperature resistant material. The heat dissipation rack 6, the frame body 4, the PCB 3 and the top cover 5 are made of a second high-temperature resistant material.

When the high-temperature resistant solid-state relay according to Embodiment 1 of the present disclosure is used, the solid-state relay is connected to a circuit that needs to be protected. When the switch component 2 in the solid-state relay generates heat, the bottom board 1 closely attached to the switch component 2 perform partial heat dissipation. In the process of rising of the heat emitted by the switch component 2, a part of the heat is discharged to the outside of the solid-state relay by the heat dissipation rack 6, and the other part of the heat continues to rise, passes through the PCB 3 and the top cover 5, and is finally dissipated by the top cover 5.

The high-temperature resistant solid-state relay according to Embodiment 1 of the present disclosure is provided with the heat dissipation rack 6. When the solid-state relay operates, the switch component 2 in the solid-state relay generates heat since the switch component 2 controls a high voltage. The existing solid-state relay generally has a shell tightly closed, so that the heat generated by the solid-state relay cannot be discharged from the interior of the solid-state relay in time and thus the heat is accumulated inside the solid-state relay, causing that the solid-state relay cannot continue to operate. The heat dissipation rack 6 provide an opening to the relatively closed space of the solid-state relay, so that the heat accumulated inside the solid-state relay is released.

In the prior art, the solid-state relay needs to be matched with heat sinks of different models in different use environments, resulting in that heat sinks of many models are needed. Moreover, it is impossible to design a heat sink adapting to the specific environment in a short time. In face of the fact that there are many heat sinks and it is impossible to effectively solve the problem that the operation of the solid-state relay is affected by the heat generated by the solid-state relay, the solid-state relay including the bottom board 1 made of the first high-temperature resistant material, and the heat dissipation rack 6, the frame body 4, the PCB 3 and the top cover 5 are made of the second high-temperature resistant material has high-temperature resistance. The switch component 2 is placed on the bottom board 1 in the solid-state relay. The switch component 2 is the main heating element in the solid-state relay. For the heating state of the switch component 2, the bottom board 1 made of the first high-temperature resistant material can have better heat resistance. When the switch component 2 generates heat, the bottom board 1 made of the first high-temperature resistant material can bear the higher temperature emitted by the switch component 2 at a close distance. After the solid-state relay operates for a period of time, the heat generated by the solid-state relay will rise and pass through the heat dissipation rack 6, the frame body 4, the PCB 3 and the top cover 5. The material of which the heat dissipation rack 6, the frame body 4, the PCB 3 and the top cover 5 in the solid-state relay are made is replaced with the second high-temperature resistant material. The components made of the second high-temperature resistant material can ensure that the original functionality thereof is maintained after the heat rises, thus effectively solving the problem in the prior art that the operation of the solid-state relay is affected by the heat generated by the solid-state relay. At the same time, the solid-state relay with heat resistance can dissipate heat without a heat sink, and maintain its original operating performance, which solves the problem that it is necessary to specially design the heat dissipation rack according to the use environment of the solid-state relay, so that it is convenient to use and mount the solid-state relay.

In the high-temperature resistant solid-state relay according to Embodiment 1 of the present disclosure, the heat dissipation rack 6 preferably includes a closed fence 61 and barriers 62.

The fence 61 is a concave vessel. The fence 61 is fixed on the bottom board 1. A bottom of the fence 61 is formed with a through hole 611 in which the switch component 2 is placed. The barriers 62 are evenly distributed at a top 614 of a side wall 613 of the fence 61. The frame body 4 is located above the barriers 62.

An upper bottom surface of the fence 61 is provided with four support columns 612. A bottom surface of the fence 61 is rectangular. Distribution directions of the four support columns 612 are identical to that of four corners of the bottom surface of the fence 61. The support columns 612 are higher than the barriers 62. The PCB 3 is formed with four openings corresponding to positions of the support columns 612. The four support columns 612 are located directly below the four openings. The four support columns 612 are provided with screw holes. The support columns 612 are fixed with the PCB 3 by second bolts 8.

When the solid-state relay operates, the switch component 2 in the solid-state relay will generate heat since the switch component 2 controls a high voltage. The continuous operation of the solid-state relay will accumulate heat inside the solid-state relay, so that the solid-state relay cannot continue to operate. The barriers 62 are provided at the side of the solid-state relay, which provides a certain heat dissipation ability to the solid-state relay itself while ensuring the protection of the internal chip of the solid-state relay. In this way, the heat generated by the solid-state relay will not be accumulated, preventing the rapid rise of the temperature inside the solid-state relay.

In the high-temperature resistant solid-state relay according to Embodiment 1 of the present disclosure, preferably, the first high-temperature resistant material is aluminum. The bottom board 1 is made of aluminum, which has a temperature resistant range up to 200° C. The bottom board 1 made of aluminum has both heat resistance and heat dissipation, so that the switch component 2 fixed on the bottom board 1 can perform partial heat dissipation by means of the bottom board 1, and the bottom board 1 can bear the high temperature heat continuously emitted by the switch component 2 during operation.

In the high-temperature resistant solid-state relay according to Embodiment 1 of the present disclosure, preferably, the second high-temperature resistant material is ceramic. The heat dissipation rack 6, the frame body 4, the PCB 3 and the top cover 5 are all made of ceramic, which has a temperature resistance range of 200° C.-300° C. After the solid-state relay operates for a period of time, the heat generated by the solid-state relay will rise and pass through the heat dissipation rack 6, the frame body 4, the PCB 3 and the top cover 5. Ceramic is excellent in heat resistance. The components above made of ceramic can ensure the original performance after heat resistance.

In the high-temperature resistant solid-state relay according to Embodiment 1 of the present disclosure, preferably, the switch component 2 is a carbonized metal oxide semiconductor (mos) field-effect transistor. A pin of the switch component 2 is connected with the PCB 3. The carbonized mos field-effect transistor is excellent in heat resistance, which can ensure continuous operation in a condition of continuous heating itself.

In the high-temperature resistant solid-state relay according to Embodiment 1 of the present disclosure, preferably, the bottom board 1 is poured with a high-temperature resistant epoxy resin. The high-temperature resistant epoxy resin fixes the switch component 2 generating heat on the bottom board 1. At the same time, the bottom board 1 is poured with the epoxy resin, so that the heat generated by the switch component 2 can be transferred onto the epoxy resin. The epoxy resin of a large area can assist the heat dissipation rack 6 in dissipating the heat generated by the switch component 2.

In the high-temperature resistant solid-state relay according to Embodiment 1 of the present disclosure, preferably, the tin for soldering components on the PCB 3 has a temperature resistant range of 150° C.-160° C. After the solid-state relay accumulates heat in itself due to continuous operation, a part of heat will rise along the air. When the part of the heat passes through the PCB 3, the components on the PCB 3 will not be de-soldered due to high temperature heat, thereby preventing the solid-state relay to be unusable.

In summary, the high-temperature resistant solid-state relay according to the present disclosure can solve the problem in the prior art that the operation of the solid-state relay is affected due to the heat generated by the solid-state relay in different environments, so that the solid-state relay can continue to maintain a stable operating state in the absence of a heat sink.

It should be understood that those skilled in the art can realize variation examples in conjunction with the prior art and the above embodiments, which will not be described in detail here. Such variation examples do not affect the essence of the present disclosure, which will not be described in detail here.

The preferred embodiments of the present disclosure have been described above. It should be understood that the present disclosure is not limited to the specific embodiments described above. The device and structure which are not described in detail should be understood to be implemented in a common way in this field. Those skilled in the art can make many possible changes and modifications or amendments into equivalent embodiments with equivalent changes without departing from the technical scheme of the present disclosure, which does not affect the essence of the present disclosure. Therefore, any simple amendments, equivalent changes and modifications made to the above embodiment according to the technical essence of the present disclosure without departing from the content of the technical scheme of the present disclosure still belong to the scope of protection of the technical scheme of the present disclosure.

What is claimed is:

1. A high-temperature resistant solid-state relay, comprising a bottom board, a switch component, a Printed Circuit Board (PCB), a frame body for protecting the PCB, and a top cover; wherein
    an upper surface of the bottom board is fixed with the switch component; the frame body is fixed with the bottom board; the PCB is embedded in the frame body; and the switch component is connected with the PCB;
    the PCB is provided with a large output copper column, a large input copper column, a small output control signal copper column and a small input control signal copper column; the large output copper column and the large input copper column are juxtaposed at one side, and an arrangement direction of the large output copper column and the large input copper column is regarded as a first arrangement direction; the small output control signal copper column and the small input control signal copper column are juxtaposed at an other side, and an arrangement direction of the small output control signal copper column and the small input control signal copper column is regarded as a second arrangement direction; the first arrangement direction is parallel to the second arrangement direction; the large output copper column and the small input control signal copper column are located on one same straight line; the large input copper column and the small output control signal copper column are located on an other same straight line; and top ends of the large output copper column, the large input copper column, the small output control signal copper column and the small input control signal copper column are provided with screw holes;
    the top cover is located above the frame body; the top cover is formed with fixing holes corresponding to the screw holes on the top ends of the large output copper column, the large input copper column, the small output control signal copper column and the small input control signal copper column; and the top cover is fixed with the PCB through first bolts;
    wherein the high-temperature resistant solid-state relay further comprises a heat dissipation rack;
    the heat dissipation rack is fixed with the bottom board; and the heat dissipation rack is located below the PCB;
    the bottom board is made of a first high-temperature resistant material; the first high-temperature resistant material is aluminum, which has a temperature resistant range up to 200° C.; the heat dissipation rack, the frame body, the PCB and the top cover are made of a second high-temperature resistant material; the second high-temperature resistant material is ceramic, which has a temperature resistance range of 200° C.-300° C.;
    the switch component is a carbonized Metal Oxide Semiconductor (mos) field-effect transistor; and a pin of the switch component is connected with the PCB.

2. The high-temperature resistant solid-state relay according to claim 1, wherein the heat dissipation rack comprises a closed fence and barriers;
    the fence is a concave vessel; the fence is fixed on the bottom board; a bottom of the fence is formed with a through hole in which the switch component is placed;

the barriers are evenly distributed at a top of a side wall of the fence; and the frame body is located above the barriers;

an upper bottom surface of the fence is provided with four support columns; a bottom surface of the fence is rectangular; distribution directions of the four support columns are identical to distribution directions of four corners of the bottom surface of the fence; the PCB is formed with four openings corresponding to positions of the four support columns; the four support columns are located directly below the four openings; the four support columns are provided with screw holes; and the four support columns are fixed with the PCB by second bolts.

3. The high-temperature resistant solid-state relay according to claim 1, wherein tin for soldering components on the PCB has a temperature resistant range of 150° C.-160° C.

\* \* \* \* \*